United States Patent [19]

Muraki

[11] Patent Number: 5,182,455
[45] Date of Patent: Jan. 26, 1993

[54] METHOD OF DETECTING RELATIVE POSITIONAL DEVIATION BETWEEN TWO OBJECTS

[75] Inventor: Masato Muraki, Yokohama, Japan

[73] Assignee: Canon Kabushiki Kaisha, Tokyo, Japan

[21] Appl. No.: 884,303

[22] Filed: May 11, 1992

Related U.S. Application Data

[63] Continuation of Ser. No. 767,361, Sep. 30, 1991, abandoned, which is a continuation of Ser. No. 468,601, Jan. 19, 1990, abandoned.

[30] Foreign Application Priority Data

Jan. 20, 1989 [JP] Japan ................................ 1-011294

[51] Int. Cl.⁵ .......................................... G01N 21/86
[52] U.S. Cl. ................................... 250/548; 356/401
[58] Field of Search .................. 250/548, 557, 237 G; 356/400, 401

[56] References Cited

U.S. PATENT DOCUMENTS

| | | | |
|---|---|---|---|
| 4,251,160 | 2/1981 | Bouwhuis et al. | 356/401 |
| 4,631,416 | 12/1986 | Trutna | 250/548 |
| 4,779,001 | 10/1988 | Makosch | 250/548 |
| 4,870,289 | 9/1989 | Sato et al. | 356/400 |
| 4,902,133 | 2/1990 | Tojo et al. | 356/356 |

*Primary Examiner*—David C. Nelms
*Attorney, Agent, or Firm*—Fitzpatrick, Cella, Harper & Scinto

[57] ABSTRACT

A method, usable with a workpiece having a predetermined grating pattern and to be exposed to a particular pattern through a projection lens system and by use of an exposure beam of a predetermined wavelength, for detecting a positional error of the workpiece. The method includes the steps of: providing a reference plate having first and second grating marks; irradiating the first and second grating marks with a radiation beam of a wavelength different from the predetermined wavelength, so that the first grating mark produces a first diffraction beam while the second grating mark produces a second diffraction beam; superposing, through the projection lens system, the first diffraction beam and the second diffraction beam upon one another on the predetermined grating mark to form a beam spot thereat; and detecting the positional error of the workpiece, on the basis of any deviation of the predetermined grating pattern relative to the beam spot.

27 Claims, 8 Drawing Sheets

METHOD OF DETECTING RELATIVE POSITIONAL DEVIATION BETWEEN TWO OBJECTS

This application is a continuation of prior application Ser. No. 07/767,361 filed Sep. 30, 1991, which application is a continuation of prior application, Ser. No. 07/468,601 filed Jan. 19. 1990, both now abandoned.

FIELD OF THE INVENTION AND RELATED ART

This invention relates to a method of detecting a relative positional deviation between two objects. More particularly, the invention is concerned with a method, usable with first and second objects placed at respective sites which are substantially conjugate with each other with respect to a projection lens system, for detecting any positional deviation between these objects with respect to a direction perpendicular to an optical axis of the projection lens system, by using grating marks formed on the first and second objects, respectively.

In the field of projection exposure apparatuses for the manufacture of semiconductor devices, with further increases in the degree of integration of each semiconductor device, further improvements are required with respect to an alignment process for aligning a semiconductor wafer with a reticle on which an integrated circuit pattern is formed. In order to assure high-precision alignment, it is necessary to detect any relative positional deviation between the reticle and the wafer very precisely. In consideration of this, many proposals have been made with respect to detection of relative positional deviation between two objects, such as a reticle and a semiconductor wafer or, alternatively, between a certain reference plate of an exposure apparatus and a semiconductor wafer.

An example is disclosed in U.S. Pat. No. 4,251,160, according to which grating marks are used. In this method, grating marks are formed on a reticle and a semiconductor wafer, respectively, One of the grating marks which is formed on the wafer is irradiated with a radiation beam so that positive and negative first order diffraction beams emanate therefrom. These positive and negative first order diffraction beams are superposed one upon another on another grating mark formed on the reticle, by use of a projection lens system, to form a beam spot thereat. The positive and negative first order diffraction beams are diffracted again by this grating mark and these twice-diffracted beams interfere with each other to produce an interference beam. By detecting the intensity of such an interference beam, any relative positional deviation between the reticle and the wafer can be detected. Since the intensity of the interference beam is changeable with the positional relationship between the grating mark of the reticle and the beam spot formed thereon, the relative position of the reticle and the wafer can be detected in this manner.

As regards the wavelength of a radiation beam to be used for the detection of any relative positional deviation between a reticle and a wafer, preferably the wavelength is one to which a resist applied to the semiconductor wafer is not sensitive. While this is well known in the art, in a projection exposure apparatus it is not easy to accurately detect any relative positional deviation between a reticle and a semiconductor wafer by use of a radiation beam having a wavelength different from the one used for the exposure. This is because: in order to detect the positional deviation between the reticle and the wafer accurately, it is necessary to project, with high precision and through a projection lens system of the apparatus, a beam from a mark formed on one of the reticle and the wafer to the other. Since, however, usually the projection lens system is aberration-corrected only with respect to the exposure wavelength, use of a radiation beam of a wavelength different from the exposure wavelength for the purpose of detection of positional deviation will result in failure of accurate projection of the beam from the mark formed on one of the reticle and the wafer to the other due to chromatic aberration caused by the projection lens system. By way of example, a sharp image of a mark of the semiconductor wafer cannot be formed on the reticle.

This results in failure of accurate detection of the positional deviation between the marks of the reticle and the semiconductor wafer and, thus, results in failure of accurate detection of the relative positional deviation between the reticle and the wafer.

The problem of chromatic aberration to be caused by a projection lens system, as described above, also should be considered in the above-discussed positional deviation detecting method that uses a pair of grating marks (hereinafter, such a method will be referred to as a "double grating method") if a radiation beam of a wavelength different from the exposure wavelength is used for the detection. This problem may be solved by simply using a chromatic aberration correcting optical system provided between a reticle and a projection lens system, for example. With this method, however, the optical arrangement for detection of the positional deviation becomes quite complicated. For example, on an occasion when projection exposure apparatus uses a KrF excimer laser as a light source, the exposure wavelength used is about 248 nm. If a laser beam of a wavelength 632.8 nm form a He-Ne laser is sued for detection of the positional deviation, then, because of the on-axis (or axial) chromatic aberration of the projection lens system, the imaging position of a mark of a semiconductor wafer formed through the projection lens system will be at a site about 1 m above the reticle. For correction of such on-axis chromatic aberration, an extraordinarily large correcting optical system has to be provided.

SUMMARY OF THE INVENTION

It is accordingly an object of the present invention to provide an improved positional deviation detecting method of a double grating type that uses a radiation beam of a wavelength different from an exposure wavelength.

It is another object of the present invention to provide a double grating type positional deviation detecting method which is usable without the use of any chromatic aberration correcting optical means or which is usable with the use of at least one of an on-axis chromatic aberration reducing optical system, a "chromatic aberration of magnification" correcting or reducing optical system and the like, which can be easily designed into a simple structure.

In accordance with an aspect of the present invention, there is provided a method, usable with a workpiece having a predetermined grating pattern which is to be exposed to a particular pattern through a projection lens system and by use of an exposure beam of a predetermined wavelength, for detecting a positional error of the workpiece, said method comprising the steps of: supplying a reference plate having first and second grating marks; irradiating the first and second grating marks with a radiation beam of a wavelength different from said predetermined wavelength, so that said first grating mark produces a first diffraction beam while said second grating mark produces a second diffraction beam; superposing, through the projection lens system, the first diffraction beam and the second diffraction beam upon one another on said predetermined grating mark to form a beam spot thereat; detecting the positional error of the workpiece, on the basis of any deviation of said predetermined grating pattern relative to the beam spot.

In this aspect of the present invention, the reference plate may be a reticle on which said particular pattern is formed. Also, as the radiation beam, a laser beam of a loner wavelength as compared with the exposure beam may be used.

In accordance with another aspect of the present invention, there is provided a method, usable with first and second objects placed at respective sites which are substantially conjugate with each other with respect to a projection lens system and with respect to a predetermined wavelength, for detecting a positional deviation between the first and second objects with respect to a direction perpendicular to an optical axis of the projection lens system, said method comprising the steps of: forming first and second grating marks on the first object and forming a third grating mark on the second object; irradiating the first and second grating marks with a radiation beam of a wavelength different form said predetermined wavelength, so that said first grating mark produces a first diffraction beam while said second grating mark produces a second diffraction beam; superposing, through the projection lens system, the first diffraction beam and the second diffraction beam upon one another on said third grating mark to form a beam spot thereat; and detecting a relative positional deviation between the first and second objects with respect to the perpendicular direction, on the bias of any relative positional deviation of said third grating mark to the beam spot with respect to the perpendicular direction.

In accordance with a further aspect of the present invention, there is provided a method, usable with first and second objects placed at respective sites which are substantially conjugate with each other with respect to a projection lens system and with respect to a predetermined wavelength, for detecting a positional deviation between the first and second objects with respect to a direction perpendicular to an optical axis of the projection lens system, said method comprising the steps of: forming first and second grating marks on the first object and forming a third grating mark on the second object; irradiating the first and second grating marks with a radiation beam of a wavelength different from the predetermined wavelength; superposing, through the projection lens system, a first diffraction beam produced by said first grating mark as a result of the irradiation and a second diffraction beam produced by said second grating mark as a result of the irradiation, upon one another on said third grating mark to form a beam spot thereat; causing interference between a first twice-diffracted beam produced as a result of diffraction of the first diffraction beam by said third grating mark in said superposing step, and a second twice-diffracted beam produced as a result of diffraction of the second diffraction beam by said third grating mark in said superposing step, to produce an interference beam, wherein the interference beam has an intensity which is variable with a positional relationship between the beam spot and said third grating mark with respect to the perpendicular direction; and detecting a relative positional deviation between the first and second objects with respect to the perpendicular direction, on the basis of detection of the interference beam.

In accordance with still a further aspect of the present invention, there is provided a method, usable with first and second objects placed at respective sites which are substantially conjugate with each other with respect to a projection lens system and with respect to a predetermined wavelength, for detecting a positional deviation between the first and second objects with respect to a direction perpendicular to an optical axis of the projection lens system, said method comprising the steps of: forming first and second grating marks on the first object and forming a third grating mark on the second object, wherein said first and second grating marks have grating lines which are substantially parallel to each other and wherein said first and second grating marks are formed with a predetermined spacing; irradiating the first and second grating marks with a radiation beam of a wavelength different from said predetermined wavelength, so that said first grating mark produces a substantially parallel positive first order diffraction beam while said second grating mark produces a substantially parallel negative first order diffraction beam; superposing, through the projection lens system, the positive first order diffraction beam and the negative first order diffraction beam upon one another on said third grating mark to form a beam spot thereat; causing interference between a first twice-diffracted beam produced as a result of diffraction of the positive first diffraction beam by said third grating mark in said superposing step and emanating substantially along the optical axis of the projection lens system, and a second twice-diffracted beam produced as a result of diffraction of the negative first order diffraction beam by said third grating mark in said superposing step and emanating substantially along the optical axis of the projection lens system, to produce an interference beam, wherein the interference beam has an intensity which is variable with a positional relationship between eh beam spot and said third grating mark with respect to the perpendicular direction; and detecting a relative positional deviation between the first and second objects with respect to the perpendicular direction, on the basis of detection of the interference beam, wherein said first and second grating marks are cooperable with each other to form, on said third grating mark and by use of the radiation beam and the projection lens system, an image of an imaginary alignment mark which is set at a side of the projection lens system remote from the first object.

In the present invention, as will be described later in detail, the first and second diffraction beams from the grating marks of the first object such as a reticle can be substantially completely superposed one upon another on the grating mark of the second object such as a wafer. However, this is not a requirement, and these diffraction beams may be partially superposed one upon another on the grating mark of the second object. How to embody the present invention or how to arrange a structure embodying the present invention can be determined conveniently in accordance with a desired precision with respect to detection of positional deviation.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
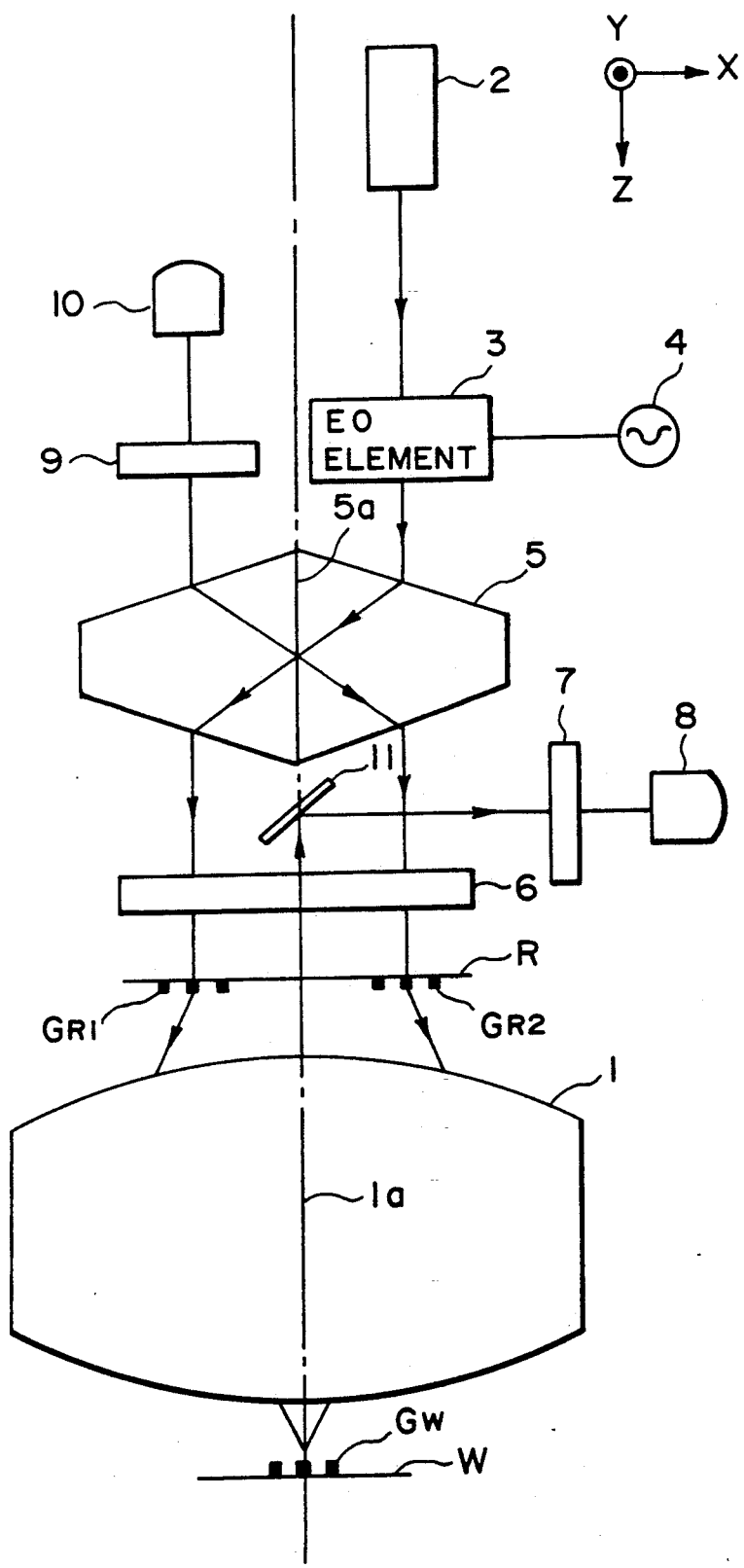
FIG. 1 is a schematic view of a positional deviation detecting optical arrangement in a semiconductor device manufacturing projection exposure apparatus, according to an embodiment of the present invention.

FIG. 1 is a schematic view of a positional deviation detecting optical arrangement of a semiconductor device manufacturing projection exposure apparatus, to which an embodiment of the present invention is applied.

The projection exposure apparatus shown in FIG. 1 uses a KrF excimer laser as an exposure light source, and includes a reduction projection lens system 1 for projection exposure purposes. The projection lens system 1 is aberration-corrected with respect to the wavelength $\lambda = 248.4$ nm to be supplied from the KrF excimer laser, so as to assure that an image of an electronic circuit pattern formed on a reticle R is accurately projected on a wafer W which is coated with a resist. The reticle R and the wafer W are disposed at respective positions which are optically conjugate with each other with respect to the projection lens system 1 and with respect to the wavelength 148.4 nm.

The projection lens system 1 has an optical axis $1a$ which is set to be parallel to a Z-axis direction. The reticle R and the wafer W can be displaced in an X-axis direction an a Y-axis direction which are perpendicular to the optical axis $1a$. The displacement of each of the reticle R and the wafer W is made by using a corresponding movable stage, not shown.

Figure 2:
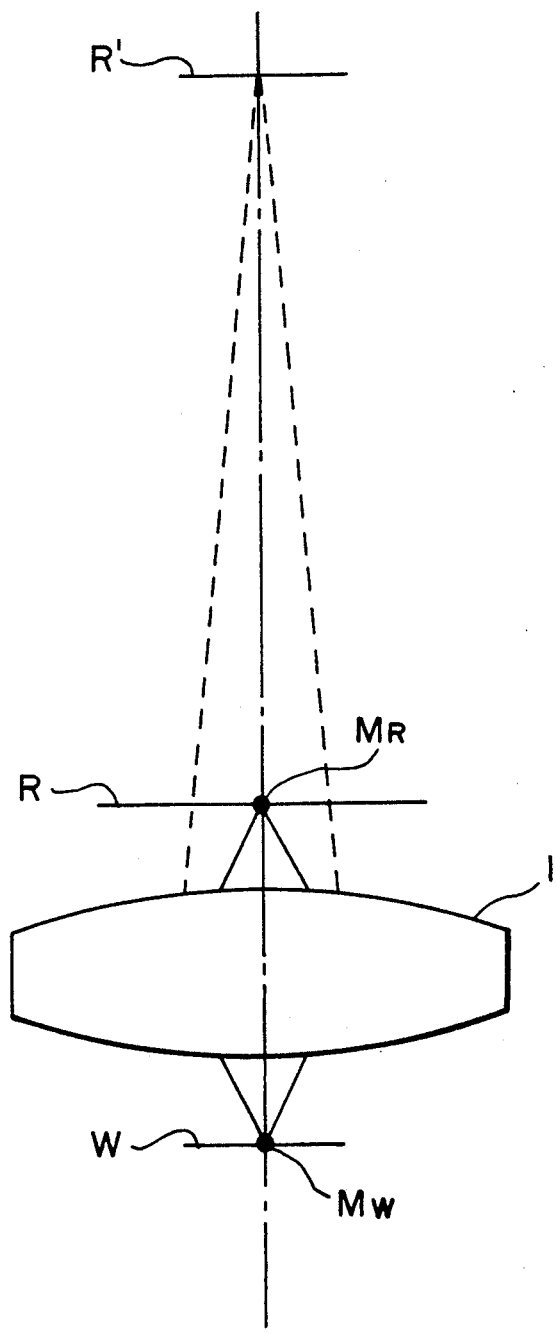
FIG. 2 is a schematic view, illustrating on-axis chromatic aberration caused by a projection lens system.

The positional deviation detecting optical system of the present embodiment uses a laser beam from a He-Ne laser 2. This laser beam has a wavelength $\lambda = 632.8$ nm largely different from the exposure wavelength $\lambda = 248.4$ nm. Referring now to FIG. 2, when such a laser beam is used in combination with the projection lens system 1 to project a certain mark $M_W$ provided on the wafer W to the reticle R side, an image of the mark $M_W$ is formed at a position R' above the reticle R and far removed form the reticle R, as depicted by broken lines in FIG. 2. This results from on-axis chromatic aberration (axial chromatic aberration) produced by the projection lens system 1. A similar phenomenon occurs when a certain mark $M_R$ provided on the reticle R is projected through the projection lens system 1 to the wafer W side. In order to correct such a shift of the imaging position of the mark $M_W$ or $M_R$ resulting from the on-axis chromatic aberration, usually a special optical system for chromatic-aberration correction is used. However, the present embodiment solves such a problem of on-axis chromatic aberration without using such a aberration-correcting optical system.

Referring back to FIG. 1, denoted at 3 is an electrooptic device (EO device) which serves to shift the phase of light inputted thereto. Denoted at 4 is an actuating means for applying an electric voltage to the electrooptic device 3. In accordance with the magnitude of the voltage applied to the electrooptic device 3 from the actuating means 4, the amount of shift of the phase inputted to the electrooptic device 3 is determined. An acoustooptic device (AO device) may be used in place of the electrooptic device 3. Denoted at 5 is a light dividing prism which comprises a pair of cemented dove type prisms (trapezoidal prisms). At the contact surface of these prisms, a polarization beam splitting surface $5a$ is formed by which light inputted thereto is divided into a P-polarized light component and an S-polarized light component. More particularly, the P-polarized component is transmitted through the surface $5a$, while the S-polarized component is reflected by the surface $5a$. Denoted at 6 is a quarter waveplate which serves to transform the P-polarized light and the S-polarized light, inputted thereto, into circularly polarized light beam of clockwise rotation and counterclocksie rotation, respectively. Further, the quarter waveplate 6 functions to transform a received circularly polarized light of clockwise rotation into an S-polarized light, and also to transform a received circularly polarized light of counterclockwise rotation into a P-polarized light.

Denoted at $G_{R1}$ and $G_{R2}$ are first and second grating marks formed on the reticle R for alignment purposes. Denoted at $G_W$ is a third grating mark (wafer alignment mark) formed on the wafer W for alignment purposes. Denoted at 8 and 10 each is a photoelectric converting element; at 7 and 9, each is an analyzer, and at 11 is a small reflecting mirror. Output signals from the photoelectric converting elements 8 and 10 are used in combination with a central processing unit (not shown), for detection of any relative positional deviation of the reticle R and the wafer W. The direction of polarization of each of the analyzers 7 and 9 is set at an angle of 45 degrees with respect to both the direction of polarization of the P-polarized light and the direction of polarization of the S-polarization light. Accordingly, the direction of polarization of the analyzer 7 has an angle of 45 degrees with respect to each of the Y-axis direction and the Z-axis direction, while the direction of polarization of the analyzer 9 has an angle of 45 degrees with respect to each of the X-axis direction and the Y-axis direction.

The He-Ne laser 2 emits a rectilinearly polarized parallel laser beam. This laser beam is inputted to the electrooptic device 3. Here, the orientation of the crystal axis (optic axis) of the electrooptic device 3 is set at a predetermined angle with respect to the direction of polarization of the inputted laser beam. With this structure, by the cooperation of the electrooptic device 3 and the actuating means 4, phase modulation can be made to the P-polarized component and the S-polarized component of the laser beam, independently of each other. The laser beam passing the electrooptic device 3 is inputted to the light dividing prism 5 and, by the polarization beam splitting surface 5a of the prism 5, it is divided into a P-polarized component and an S-polarized component. The P-polarized light transmitted through the polarization beam splitting surface 5a and the S-polarized light reflected by the polarization beam splitting surface 5a, after they emanate from the prism 5, are inputted perpendicularly to the quarter waveplate 6. Under the influence of the quarter waveplate 6, the P-polarized light is transformed into a circularly polarized light of clockwise rotation and then is inputted perpendicularly onto the reticle R. On the other hand, the S-polarized light is transformed under the influence of the quarter waveplate 6 into a circularly polarized light of counterclockwise rotation and then is inputted perpendicularly onto the reticle R. As a result, the grating marks $G_{R1}$ and $G_{R2}$ provided on the reticle R are illuminated, each with a parallel laser beam and from a direction (Z-axis direction) perpendicular to the reticle R surface. The grating marks $G_{R1}$ and $G_{R2}$ illuminated with the laser beams serve to diffract the received laser beams, respectively, and the grating mark $G_{R1}$ produces and emits a positive first order transmissive diffraction beam while the grating mark $G_{R2}$ produces and emits a negative first order transmissive diffraction beam, in this embodiment. Each of these positive and negative first order diffraction beams is still in the form of a parallel beam. The positive and negative first order diffraction beams are inputted to the projection lens system 1, through which they are directed to the grating mark $G_W$ provided on the wafer W. The positive and negative first order diffraction beams impinging on the grating mark $G_W$ are each a parallel beam, and they are projected on the grating mark $G_W$ from different directions and are superposed one upon another to form a beam spot on the grating mark $G_W$.

The positive and negative first order diffraction beams incident on the grating mark $G_W$ are reflectively diffracted by the grating mark $G_W$. The reflective diffraction beam produced as a result of the diffraction of the positive first order diffraction beam by the grating mark $G_W$ as well as the reflective diffraction beam produced as a result of the diffraction of the negative first order diffraction beam by the same grating mark $G_W$, go along the optical axis of the projection lens system 1 while being superposed one upon another. These diffraction beams are directed through the projection lens system 1 to the reticle R side, and they are reflected by the reflecting mirror 11 and are received by the analyzer 7. Under the influence of this analyzer 7, the diffraction beams can be received by the photoelectric converting element 8 in the form of an interference beam. The photoelectric converting element 8 serves to convert the received interference beam into an electric signal. Here, the level of this signal, that is, the intensity of the interference beam, is variable, according to depending the relative position of the grating mark $G_W$ with respect to the beam spot formed thereon. Accordingly, on the basis of the output signal from the photoelectric converting element 8, any relative positional deviation of the reticle R and the wafer W can be detected. Once such positional deviation is detected, at least one of the reticle R and the wafer W is displaced in a direction perpendicular to the optical axis 1a so that they can be aligned with each other.

In the present embodiment, the grating marks $G_{R1}$ and $G_{R2}$ of the reticle R are formed in accordance with a holographic method. This method includes not only an ordinary hologram forming method based on dual-beam interference, but also a method wherein a grating shape obtained by use of a computer is reproduced lithographically. On the other hand, the grating mark $G_W$ of the wafer W is formed in accordance with a wafer alignment mark forming method which is well known in the art, and, in this embodiment, the wafer grating mark comprises a relief-shape grating pattern. For convenience of explanation, in the following part of this Specification, the grating marks of the reticle R will be referred to as "hologram $G_{R1}$" and hologram $G_{R2}$", so that they can be clearly distinguished from the grating marks of the wafer W.

Figure 3:
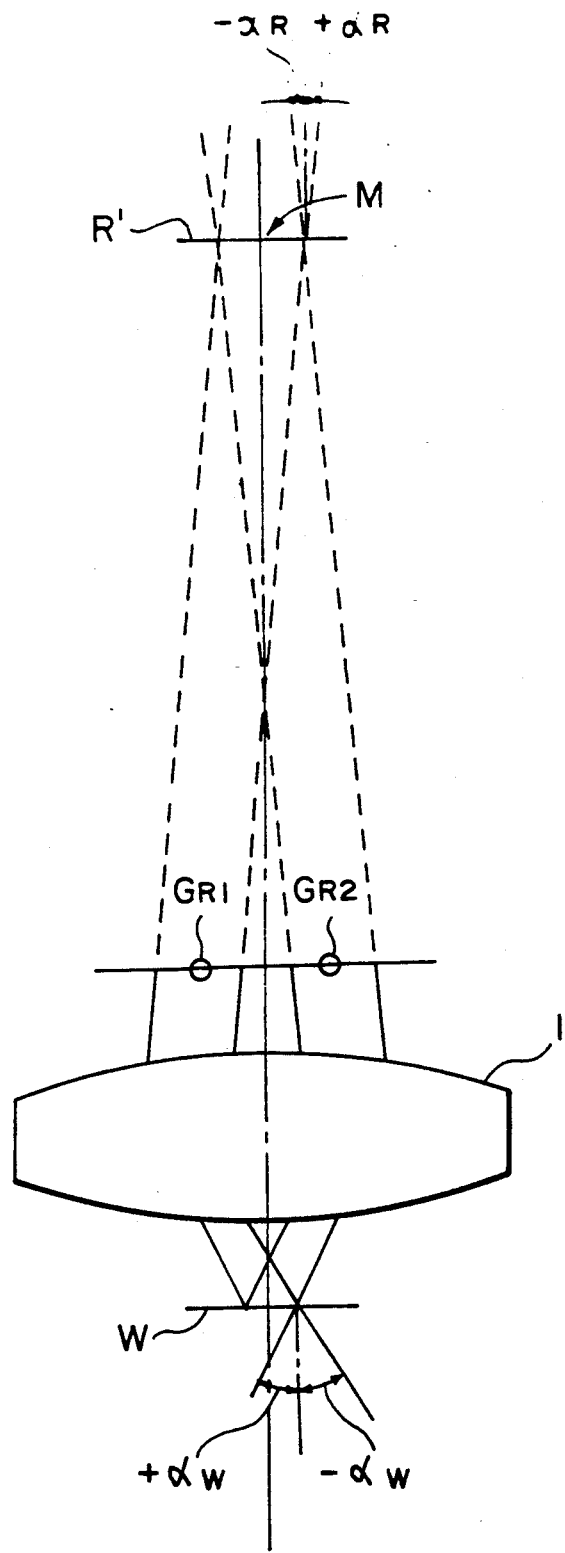
FIG. 3 is a principle view, illustrating the function of first and second grating marks formed on a reticle.

Referring now to FIG. 3, when used with light of a certain wavelength ($\lambda$=632.8 nm in this embodiment), the holograms $G_{R1}$ and $G_{R2}$ of the reticle R, as they are so called, serve to reproduce on the wafer W and through the projection lens system 1 an image of an illumination region M (which may be considered as an imaginary alignment mark) which is set at a position R' above the reticle R. This can be considered as being equivalent to the following: an illumination region M defined by an aperture is set at the position R' and this region M is illuminated with two parallel lights of a wavelength $\lambda$=632.8 nm, from two different directions. The two parallel lights passing the region M are inputted to the projection lens system 1 by which they are superposed one upon another on the wafer W surface disposed in an optically conjugate relationship with the position R', to form a beam spot on the wafer W surface.

Accordingly, when the holograms $G_{R1}$ and $G_{R2}$ are to be formed in accordance with the ordinary dual-beam interference method, the parallel lights (object light) of a wavelength 632.8 nm from the illumination region M at the position R' in FIG. 3 should interfere with a predetermined reference light of a wavelength 632.8 nm, upon the reticle R surface. Here, if the positional deviation detecting optical system is set so as to illuminate the holograms $G_{R1}$ and $G_{R2}$ perpendicularly as shown in FIG. 1, the reference light is inputted perpendicularly to the reticle R.

It is very easy to form the holograms $G_{R1}$ and $G_{R2}$ by use of a computer, as described hereinbefore. Accordingly, in the present embodiment, the holograms $G_{R1}$ and $G_{R2}$ were formed in accordance with this method. More specifically, since the shape of an interference fringe to be formed by an object light and a reference light is determined according to wavefronts of these lights, such a shape was detected by using a computer and, in accordance with the result, a grating corresponding to such an interference fringe was drawn on the reticle R. In this manner, the holograms $G_{R1}$ and $G_{R2}$ were formed.

In FIG. 3, the hologram $G_{R1}$ is such a hologram that serves to direct a parallel beam, illuminating the illumination region M at the position R' from a direction of an angle $+\alpha_R$, through the projection lens system 1 to the wafer W thereby to illuminate the wafer W with this parallel beam, from a direction of an angle $+\alpha_W$. If the imaging magnification with respect to formation of the image of the region M at the position R' upon the wafer W through the projection lens system 1, with respect to the wavelength 632.8 nm, is denoted by $\beta$, then the angles $\alpha_R$ and $\alpha_W$ are in the following relationship:

$$\alpha_W = \alpha_R/\beta$$

On the other hand, the hologram $G_{R2}$ is such a hologram that directs the parallel beam, illuminating the region M at the position R′ from a direction of an angle $-\alpha_R$, through the projection lens system 1 to the wafer W to thereby illuminate the wafer W with this parallel beam from a direction of an angle $-\alpha_W$.

Illuminating the wafer W in this manner by using the holograms $G_{R1}$ and $G_{R2}$ can be made by inputting to the reticle R a light the same as the reference light so that an object light is reproduced.

Figure 4:
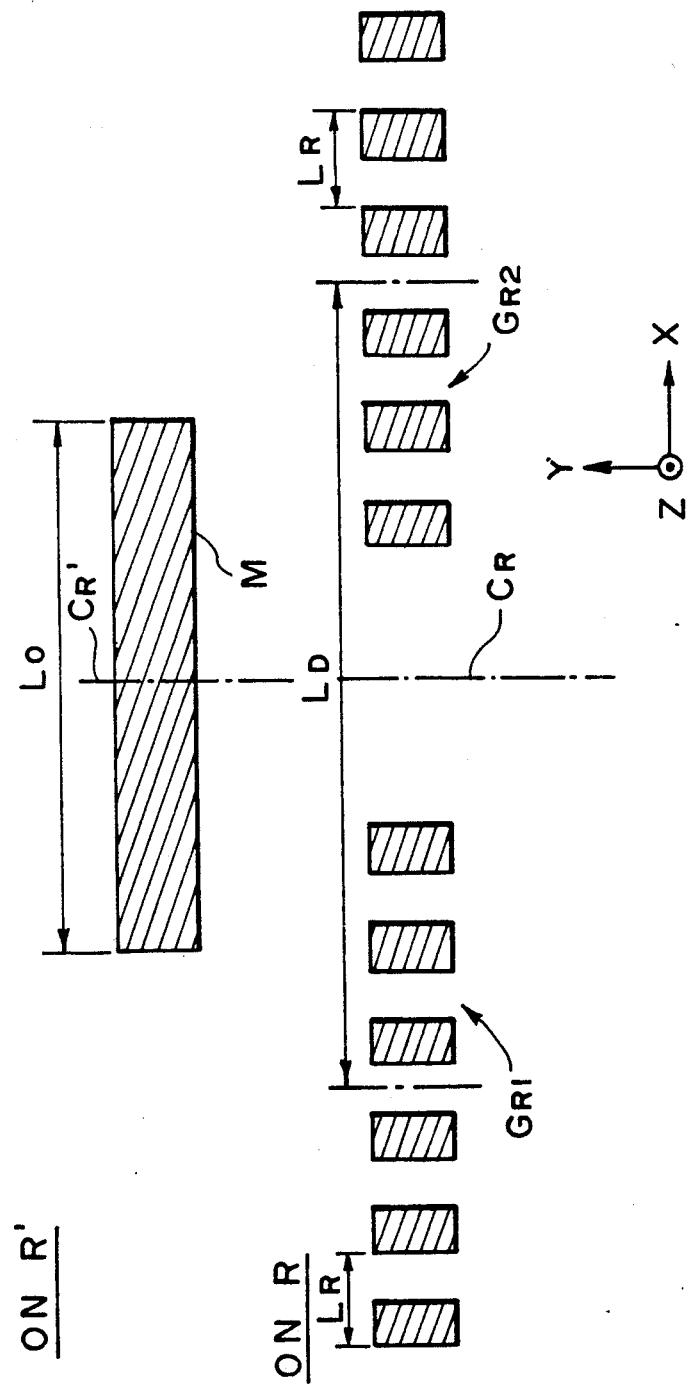
FIG. 4 is a schematic view, exemplifying an illumination region M (imaginary alignment mark) and first and second grating marks formed on a reticle.

FIG. 4 illustrates the shape of the illuminate region M (imaginary alignment mark) at the position R′ as well as the shapes of the holograms $G_{R1}$ and $G_{R2}$ on the reticle R surface. Central axis CR′ of the region M is aligned with the center CR between the central axes of the holograms $G_{R1}$ and $G_{R2}$. The central axes of the holograms $G_{R1}$ and $G_{R2}$ are spaced by a distance Ld which is determined by the on-axis chromatic aberration to be produced by the projection lens system 1, and each of these holograms is provided by a grating pattern having a pitch LR.

In FIG. 3, hatched areas denote transparent areas which are transparent with respect to the laser beam from the He-Ne laser 2. The remaining ares are non-transparent with respect to the laser beam from the He-Ne laser 2. In the present embodiment, the non-transparent areas of the holograms $G_{R1}$ and $G_{R2}$ are formed by a chromium film.

If the wavelength emitted by the He-Ne laser is denoted by $\lambda$, then the pitch LR of the holograms $G_{R1}$ and $G_{R2}$ has the following relationship:

$$LR = \lambda/\sin \alpha_R$$

As a result, in FIG. 1, each of the holograms $G_{R1}$ and $G_{R2}$ produces a first order diffraction beam. The grating lines of the holograms $G_{R1}$ and $G_{R2}$ are parallel to each other and are oriented in the Y-axis direction. This direction of orientation is perpendicular to the direction of array (X-axis direction) of the chromium patterns forming the holograms $G_{R1}$ and $G_{R2}$. The direction of array coincides with the direction with respect to which any positional deviation between the reticle R and the wafer W should be detected. The grating mark $G_W$ of the wafer W is defined by grooves arrayed in this direction, as will be described later.

Referring back to FIG. 1, when the linearly polarized laser beam emanating from the He-Ne laser 2 is inputted to the electrooptic device 3, if the axis of advancement of the laser beam is denoted by Z while the axes perpendicular to the Z-axis and being orthogonal to each other are denoted by X and Y and if $k = 2\pi/\lambda$, then the complex amplitudes $A_X$ and $A_Y$ of the two linearly polarized components (P-polarized component and S-polarized component) of the inputted laser beam, can be expresses as follows:

$$A_X = A_0 \exp(-ikt)$$

$$A_Y = A_0 \exp(-ikt)$$

If a phase difference $\Delta E$ is applied between the two polarization components by the cooperation of the electrooptic device 3 and the actuating means 4, then the complex amplitudes $A_X$ and $A_Y$ of the two polarization components are:

$$A_X = A_0 \exp(-ikt)$$

$$A_y = A_0 \exp[i(kt - \Delta E)]$$

Here, as described hereinbefore, from the laser beam passing the electrooptic device 3, the P-polarized light ($A_X$) transmitted through the light dividing prism 5 passes the quarter waveplate 6 by which it is transformed into a circularly polarized light of clockwise rotation which in turn is inputted perpendicularly to the hologram $G_{R1}$. The S-polarized light ($A_Y$) reflected by the light dividing prism 5 passes the quarter waveplate 6 by which it is transformed into a circularly polarized light of counterclockwise rotation which in turn is inputted perpendicularly to the hologram $G_{R2}$.

The lights impinging on the holograms $G_{R1}$ and $G_{R2}$ go through the projection lens system 1 and illuminate the wafer W from a direction of an angle $+\alpha_W$ and a direction of an angle $-\alpha_W$, respectively.

Figure 5:
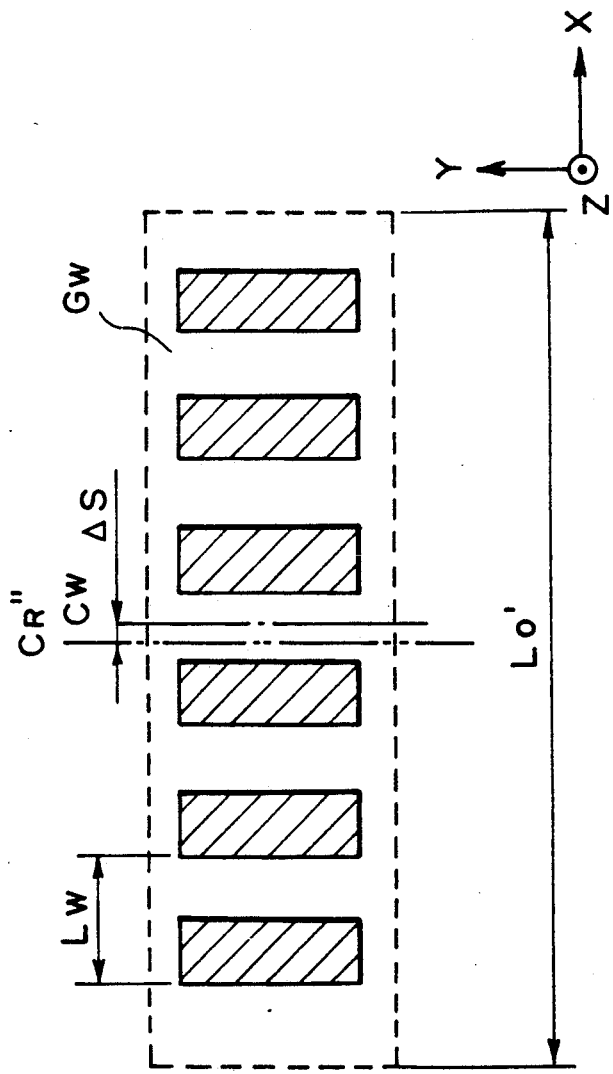
FIG. 5 is a schematic view, illustrating an example of a grating mark formed on a wafer.

As illustrated in FIG. 5, the grating mark $G_W$ of the wafer W comprises a number of grooves arrayed at a pitch $L_W$. In the illustrated example, hatched areas depict the grooves.

If n is a positive integral number, then the pitch $L_W$ has the following relationship:

$$L_W = n\lambda/\sin \alpha_W$$

Here, the grooves of the grating mark $G_W$ extend in the Y-axis direction, and the direction of array of these grooves is coincident with the X-axis direction.

The parallel beams produced by the holograms $G_{R1}$ and $G_{R2}$ form an illumination region of a width Lo′. If the central axis of such an illumination region is denoted by $C_{R''}$, then, since the position R′ and the wafer W are in an optically conjugate relationship with respect to the projection lens system and with respect to the wavelength 632.8 nm, the axes $C_{R'}$ and $C_{R''}$ correspond to each other in a one-to-one relationship. Denoted at $C_W$ is the central axis of the wafer mark $G_W$, and the magnitude of deviation $\Delta S$ corresponds to the positional deviation between the axes $C_{R''}$ and $C_W$.

Here, the axis $C_{R'}$ is exactly aligned with the axis $C_R$ and, therefore, the positional deviation $\Delta S$ does represent the positional deviation between the reticle R and the wafer W.

Referring back to FIG. 1, the $\pm n$-th order diffraction beams diffracted by the grating mark $G_W$ of the wafer W go perpendicularly from the wafer W and, after traveling by way of the projection lens system 1, the quarter waveplate 6 and the reflecting mirror 11, they are received by the analyzer 7. At this time, these beams can be represented as follows:

The beam produced by the hologram $G_{R1}$ has a complex amplitude $A_y$ which, if $$\delta = (2\pi \cdot \Delta S)/L_W$$

if the diffraction efficiency of this beam by the grating mark $G_W$ is denoted by $\epsilon$, can be expressed as follows:

$$A_y = \epsilon A_0 \exp[(-i(kt - n\delta)]$$

Similarly, the beam produced by the hologram $G_2$ has a complex amplitude $A_x$ which, if the phase difference between this beam and the beam produced by the hologram $G_{R1}$ is denoted by $\Delta E$, can be expressed as follows:

$$A_X = \epsilon A_0 \exp[-1(kt + n\delta - \Delta E)]$$

Since the analyzer 7 is disposed so that the direction of polarization thereof is set at an angle of 45 degrees with respect to the direction of polarization of each of the $\pm n$-th order diffraction beams, the intensity Isig of the interference beam to be detected by the photoelectric converting element 8 is given by:

$$\text{Isig} = (\epsilon^2 A_0^2)/2 \times [i + \cos(2n\delta - \Delta E)]$$

Figure 6:
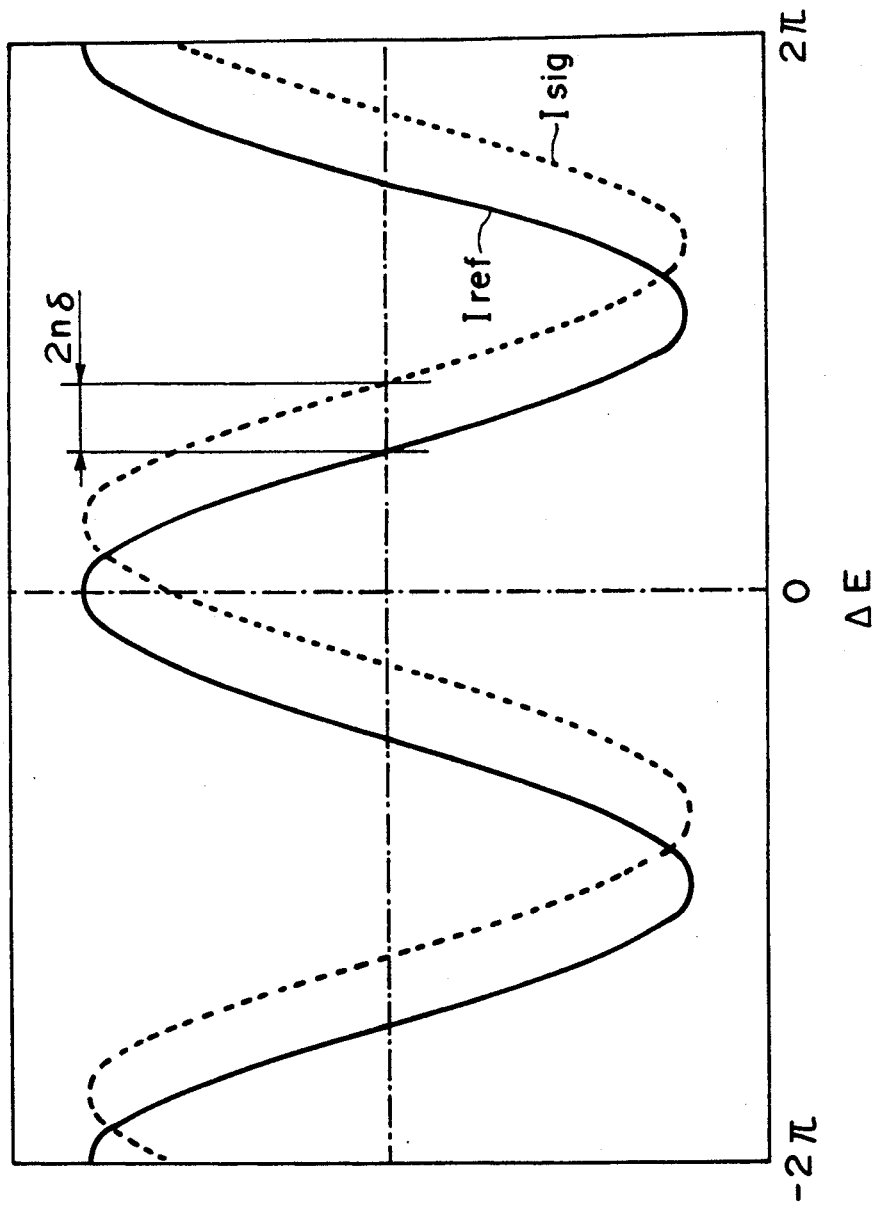
FIG. 6 is a graph showing a positional deviation signal which is obtainable through the detection optical arrangement.

In the present embodiment, if $(\epsilon^2 A^2)/2 = 1$ and when the phase difference $\Delta E$ between the P-polarized component and the S-polarized component imparted by the electrooptic device 3 is periodically changed, then the intensity Isig and the phase difference $\Delta E$ are in such relationship as illustrated in FIG. 6.

Referring back to FIG. 1, those of the two beams passing through the light dividing prism 5 and impinging on the holograms $G_{R1}$ and $G_{R2}$ and directly reflected by these holograms $G_{R1}$ and $G_{R2}$, again pass through the quarter waveplate so that their states of polarization are inverted, respectively. As a result, the two reflected beams from the holograms and entering the light dividing prism 5 are respectively reflected by and transmitted through the polarization beam splitting surface 5a of the prism 5, so that they are received by the analyzer 9, respectively. The analyzer 9 is disposed so as to transmit therethrough such a polarization component having an angle of 45 degrees with respect to the directions of polarization of the two reflected beams impinging on the analyzer 9. Thus, the intensity Iref of the beam to be detected by the photoelectric converting element 10 (which can be used as a reference beam) is given by:

$$\text{Iref} = (\epsilon' A_0^2)/2 \times [1 + \cos(\Delta E)]$$

At this time, if $(\epsilon' A_0^2)/2 = 1$ and when the phase difference $\Delta E$ is changed periodically, the intensity Iref and the phase difference $\Delta E$ are in such a relationship as depicted in FIG. 6.

In the present embodiment, the phase difference $\Delta E$ is changed continuously from "0" to $2\pi$ by applying an AC voltage to the electrooptic device 3 by using the actuating means 4, and the phase difference $2n\delta$ between the light intensities Isig and Iref is detected. By this, the relative positional deviation $\Delta S$ of the reticle R and the wafer W can be detected.

Figure 7:
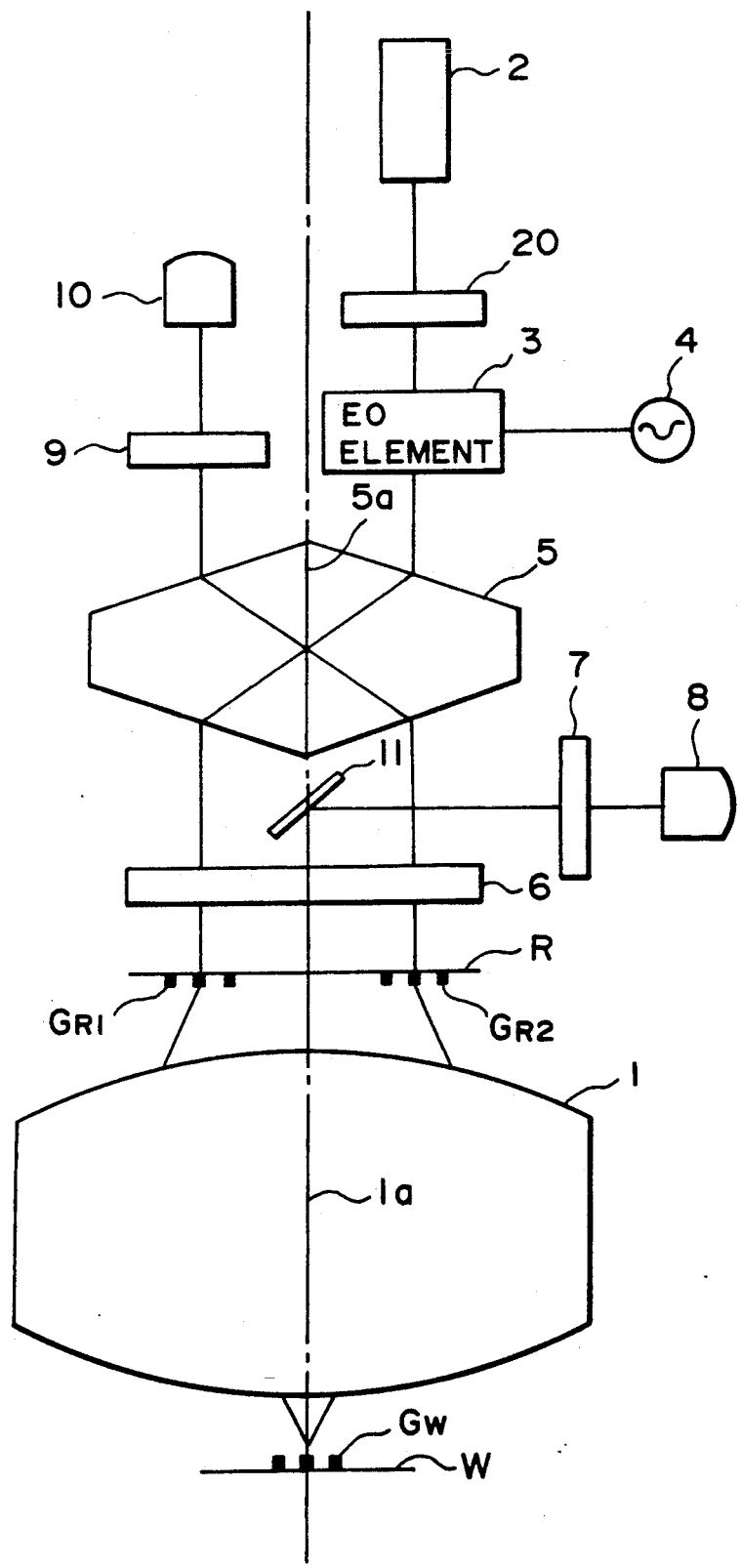
FIG. 7 is a schematic view of a positional deviation detecting optical arrangement of a semiconductor device manufacturing projection exposure apparatus, according to another embodiment of the present invention.

FIG. 7 is a schematic view of a positional deviation detecting optical arrangement of a semiconductor device manufacturing projection exposure apparatus, to which another embodiment of the present invention is applied.

In FIG. 7, the elements corresponding to of similar to those in FIG. 1 are denoted by like numerals. The present embodiment differs from the FIG. 1 embodiment, in the following points:

In the present embodiment, an additional quarter waveplate 20 is inserted between a He-Ne laser 2 and an electrooptic device 3. Thus, the complex amplitudes $A_X$ and $A_Y$ of the P-polarized component and the S-polarized component of the laser beam passed through the electrooptic device 3, are expressed as follows:

$$A_X = A_0 \exp[-i(kt - \pi/2)]$$

$$A_Y = A_0 \exp[-i(kt - \Delta E)]$$

Also, the intensity Isig of the laser beam to be detected by the photoelectric converting element 8 is given by:

$$\text{Isig} = (\epsilon^2 A^2)/2 \times [1 + \cos(2nd - (\Delta E - \pi/2))]$$

While in FIG. 1 embodiment the phase difference $\Delta E$ is changed continuously within the range of "$0 - 2\pi$", in the present embodiment the phase difference $\Delta E$ is changed alternately between "zero" and "$\pi$". Here, the intensity Isig of the interference beam is given by:

$$\text{Isig} = \epsilon A_0^2/2 \times [1 - \sin(2n\delta)] \ldots \Delta E = 0$$

$$\text{Isig} = \epsilon A_0^2/2 \times [1 + \sin(2n\delta)] \ldots \Delta E = \pi$$

Figure 8:
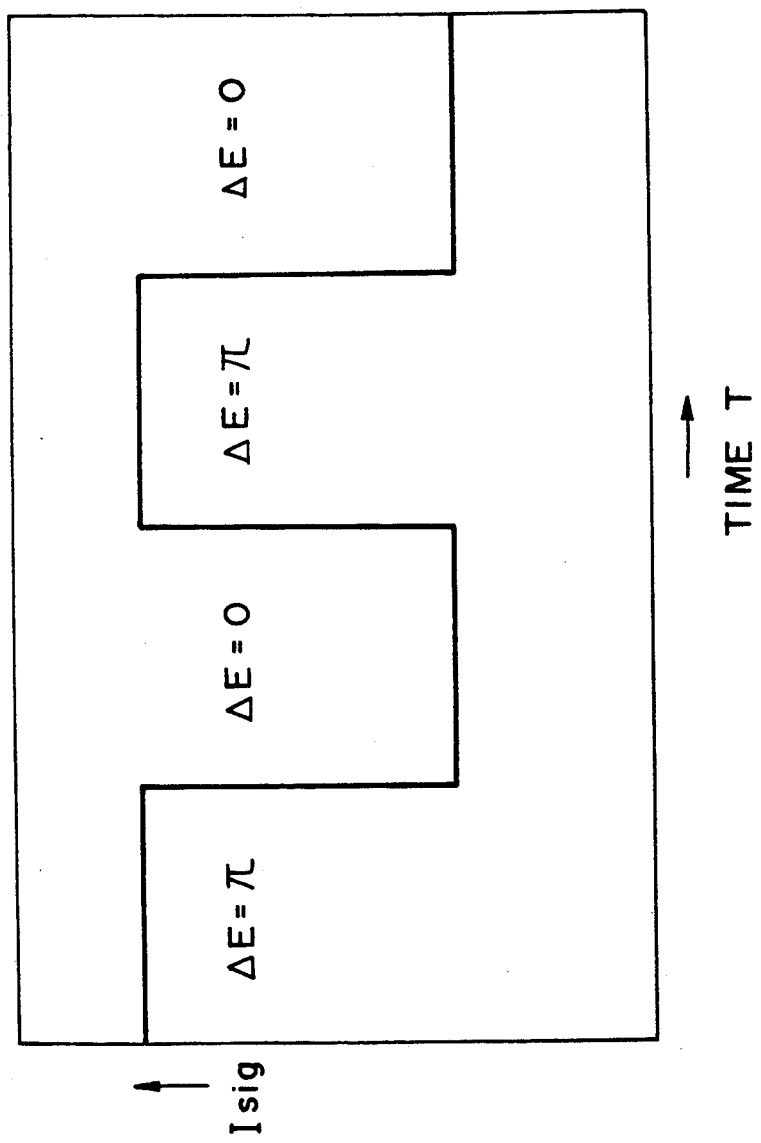
FIG. 8 illustrates a positional deviation signal which is obtainable through the detection optical arrangement of FIG. 7.

When the phase difference $\Delta E$ is changed alternately between "zero" and "$\pi$" at a certain period, the intensity Isig has such a relationship with respect to time T, as illustrated in FIG. 8. If the reticle R and the wafer W have a relative positional deviation, the intensity Isig detected by the photoelectric converting element 8 is in the form of an AC signal as illustrated. If there is no positional deviation between the reticle and the wafer, on the other hand, the intensity as detected is in the form of a DC signal. Accordingly, in the present embodiment, determination of the positional deviation is made on the basis of a discrimination of whether an obtained signal is an AC signal or a DC signal, and then the wafer W is displaced so that a light intensity Isig which is in the form of a DC signal can be obtained. By this, the reticle R and the wafer W can be aligned with each other.

In the present embodiment, the intensity Iref detected by the photoelectric converting element 10 is used as a signal for discriminating whether the phase difference between the beams perpendicularly inputted to the holograms $G_{R1}$ and $G_{R2}$ of the reticle R is of a suitable value to provide the light intensity Iref of a DC signal, and for controlling the electric voltage to be applied to the electrooptic device 3 from the actuating means 4.

While, in the embodiments described hereinbefore, those of the reflective diffraction beams from the wafer W that advance in the direction of a normal to the wafer W are used for detection of positional deviation, the present invention is not limited thereto and a pair of or pairs of diffraction beams emanating in the directions of $\gamma = \sin^{-1}(n\lambda/L_W)$ (deg.) may be detected additionally. For example, a pair of diffraction beams emanating with angles $\gamma_1 = \sin^{-1}(\lambda/L_W)$ and $\gamma_2 = \sin^{-1}(-\lambda/L_W)$ with respect to the normal to the wafer W, or a pair of diffraction beams emanating with angles $\gamma_3 = \sin^{-1}(2\lambda/L_W)$ and $\gamma_4 = \sin^{-1}(-2\lambda/L_W)$ may be used. As a further alternative, these two pairs of beams emanating with angles $\gamma_1 - \gamma_4$ may be used.

In the positional deviation detecting method according to the disclosed embodiments, two predetermined grating marks (holograms) are formed on a reticle and diffraction beams (reproduced beams) from these grating marks are used for detection of any positional deviation between the reticle and a wafer. Therefore, in the form of these embodiments, if light of a wavelength different from the exposure wavelength is used for the detection of positional deviation, the relative positional deviation of the reticle and the wafer can be detected very precisely without the addition of any optical system for correcting the on-axis chromatic aberration produced by a projection lens system. Further, in the form of these embodiments, the relative positional deviation of the reticle and the wafer can be detected without moving the reticle and the wafer and without using any movable mechanical element. Therefore, the precision is stable and high-speed detection is attainable.

Further, in the embodiments described hereinbefore, reflected lights from a pair of grating marks on a reticle are caused to interfere with each other and the intensity of such an interference beam produced thereby is detected. The detected intensity is used as a reference for detection of the positional deviation. Therefore, even if the relative position of these grating marks of the reticle changes slightly due to a relative tilt of the reticle to the optical axis of the projection lens system or due to distortion thereof caused by a thermal effect, for example, the positional deviation itself can be detected effectively.

In the foregoing embodiments, the positional deviation detecting optical arrangement does not specifically include any chromatic aberration correcting means. However, as a matter of course, if desired, the deviation detecting optical arrangement of the present invention may be used in combination with an on-axis chromatic aberration reducing optical means, for example, in consideration of any possible limitation to the locations of the marks to be provided on the reticle or to the design of each mark on the reticle, for example. On such an occasion, however, the optical means necessary for reducing the on-axis chromatic aberration can be quite easily designed into a small size and a simple structure.

In the embodiments shown in FIGS. 1 and 7, to be exact, there remains a small chromatic aberration of magnification as produced by the projection lens system 1. If it is desired to avoid the effect of such aberration for further enhancement of the detection precision, then the grating marks of the reticle and the wafer may be modified so that the grating lines or grooves of each grating mark, as a whole, elongate substantially toward the optical axis of the projection lens system 1. With this structure, the effect of the chromatic aberration of magnification of the projection lens system can be reduced. Alternatively, an optical system for correcting or reducing the chromatic aberration of magnification may be added between the reticle and the projection lens system, for example, if to do so is desired. As a further alternative, the effect of such chromatic aberration of magnification may be detected in preparation as an "offset" and, during actual measurement of the relative positional deviation of the reticle and the wafer, the positional deviation may be determined in consideration of the predetected offset data.

Further, in the foregoing embodiments, the electrooptic device 3 and the actuating means 4 are used to change the phase difference between the beams irradiating the grating marks $G_{R1}$ and $G_{R2}$ and, while doing so, detection of the interference beam, i.e., detection of positional deviation is executed by use of the photoelectric converting element 8. However, the invention is not limited to this and the positional deviation can be detected without use of the combination of the electrooptic device 3 and the actuating means 4. More particularly, since in the positional deviation detecting method described hereinbefore the intensity of the interference beam corresponds to the magnitude of the positional deviation, it is easy to detect the positional deviation by comparing the intensity of the detected interference beam with a reference intensity which is the intensity, as can be predetected, of the interference beam when no positional deviation is present between the reticle and the wafer.

While the invention has been described with reference to the structures disclosed herein, it is not confined to the details set forth and this application is intended to cover such modifications or changes as may come within the purposes of the improvements or the scope of the following claims.

What is claimed is:

1. A method, usable with first and second objects placed at respective sites which are substantially conjugate with each other with respect to a projection lens system and with respect to a predetermined wavelength, for detecting a positional deviation between the first and second objects with respect to a direction perpendicular to an optical axis of the projection lens system, said method comprising the steps of:

forming first and second grating marks of the first object and forming a third grating mark on the second object;

spacing apart the first and second grating marks of the first object by a distance related to axial chromatic aberration of the projection lens system with respect to a difference between the predetermined wavelength and a wavelength different from the predetermined wavelength;

irradiating the first and second grating marks with first and second radiation beams, each having wavelengths different from the predetermined wavelength;

superposing, through the projection lens system, a first diffraction beam produced by the first grating mark as a result of the irradiation and a second diffraction beam produced by the second grating mark as a result of the irradiation, upon one another on the third grating mark to form a beam spot thereat;

causing interference between a first twice-diffracted beam produced as a result of diffraction of the first diffraction beam by the third grating mark in superposing step, and a second twice-diffracted beam produced as a result of diffraction of the second diffraction beam by the third grating mark in said superposing step, to produce an interference beam, wherein the interference beam has an intensity which is variable with a positional relationship between the beam spot and the third grating mark with respect to the perpendicular direction and said irradiating step comprises periodically changing phase difference between the first and second radiation beams, to thereby modulate the intensity of the interference beam;

detecting a relative positional deviation between the first and second objects with respect to the perpendicular direction, on the basis of the detection of the interference beam;

causing third and fourth reflection beams produced as a result of regular reflection of the first and second radiation beams by the first and second grating marks, respectively, to interfere with each other to form a reference interference beam; and detecting the formed reference beam to produce a reference signal having a predetermined phase, wherein in said detecting step the interference beam is converted into a signal and, on the basis of a phase difference between the obtained signal and the reference signal, any relative positional deviation of the first and second objects is detected.

2. A method according to claim 1, wherein each of said first and second grating marks is formed in accordance with a holographic method and wherein said third grating mark is provided by a relief-like grating.

3. A method according to claim 1, further comprising relatively scanning the second object with the beam spot.

4. A method according to claim 3, further comprising conducting said irradiating and superposing steps so that each of said first and second twice-diffracted beams is produced in a direction parallel to the optical axis of the projection lens system.

5. A method according to claim 4, wherein said first and second diffraction beams are formed by beams passed through said first and second grating marks, respectively and wherein said first and second twice-diffracted beams are formed by beams reflected by said third grating mark.

6. A method according to claim 1, wherein the predetermined wavelength is a wavelength in the ultraviolet region, and wherein said radiation beam comprises a laser beam having a wavelength longer than the predetermined wavelength.

7. A method according to claim 6, wherein said first and second grating marks are adapted to form, on said third grating mark and in corporation with said laser beam and the projection lens system, an image of an imaginary alignment mark set at a side of the first object remote from the projection lens system.

8. A method according to claim 7, wherein said first diffraction beam is a positive first order diffraction beam and said second diffraction beam is a negative first order diffraction beam.

9. A method, usable with first and second objects placed at respective sites which are substantially conjugate with each other with respect to a projection lens system and with respect to a predetermined wavelength, for detecting a positional deviation between the first and second objects with respect to a direction perpendicular to an optical axis of the projection lens system, said method comprising the steps of:

forming first and second grating marks of the first object and forming a third grating mark on the second object, wherein the first and second grating marks have grating lines which are substantially parallel to each other, and arranging the first and second grating marks with a predetermined spacing related to axial chromatic aberration of the projection lens system with respect to a difference between the predetermined wavelength and a wavelength different from the predetermined wavelength;

irradiating the first and second grating marks with first and second radiation beams, each having wavelengths different from the predetermined wavelength, so that the first grating mark produces a substantially parallel positive first order diffraction beam while the second grating mark produces a substantially parallel negative first order diffraction beam;

superposing, through the projection lens system, the positive first order diffraction beam and the negative first order diffraction beam upon on another on the third grating mark to form a beam spot thereat;

causing interference between a first twice-diffracted beam produced as a result of diffraction of the positive first diffraction beam by the third grating mark in said superposing step and emanating substantially along the optical axis of the projection lens system, and a second twice-diffracted beam produced as a result of diffraction of the negative first order diffraction beam by the third grating mark in said superposing step and emanating substantially along the optical axis of the projection lens system, to produce an interference beam, wherein the interference beam has an intensity which is variable with a positional relationship between the beam spot and the third grating mark with respect to the perpendicular direction and said irradiating step comprises periodically changing phase difference between the first and second parallel radiation beams, to thereby modulate the intensity of the interference beam;

detecting a relative positional deviation between the first and second objects with respect to the perpendicular direction, on the basis of the detection of the interference beam, wherein the first and second grating marks cooperate with each other to form, on the third grating mark and by use of the radiation beam and the projection lens system, an image of an imaginary alignment mark which is set at a side of the projection lens system remote from the first object;

causing third and fourth reflection beams produced as a result of regular reflection of the first and second parallel radiation beams by the first and second grating marks, respectively, to interfere with each other to form a reference interference beam; and detecting the formed reference interference beam to produce a reference signal having a predetermined phase, wherein in said detecting step the interference beam is converted into a signal and, on the basis of a phase difference between the obtained signal and the reference signal, any relative positional deviation of the first and second objects is detected.

10. A method according to claim 9, wherein the predetermined wavelength is a wavelength in the ultraviolet region, and wherein said radiation beam comprises a laser beam having a wavelength longer than the predetermined wavelength.

11. A method according to claim 9, further comprising relatively scanning the second object with the beam spot.

12. A method according to claim 9, wherein each of said first and second grating marks is formed in accordance with a holographic method and wherein said third grating mark is provided by a relief-like grating.

13. A method of detecting positional deviation between a first object having a grating pattern and a second object having a grating mark, wherein the first and second objects are placed at positions that are optically conjugate with each other with respect to a projection lens system and with reference to a first wavelength, wherein the grating pattern of the first object has spaced first and second zones that produce, when respectively illuminated with first and second beams, each having a second wavelength different from the first wavelength, first and second transmissively diffracted beams, respectivley, which are projected through the projection lens system upon the grating mark of the second object, said method comprising the steps of:

illuminating the first zone with the first beam to produce the first transmissively diffracted beam as well as a first reflected beam from the first zone;

illuminating the second zone with the second beam to produce the second transmissivley diffracted beam as well as a second reflected beam from the second zone;

diffracting the first and second transmissively diffracted beams again by the grating mark of the second object to produce twice-diffracted beams which are then caused to interfere with each other to produce a first interference beam and wherein the first and second reflected beams are caused to interfere with each other to produce a second interference beam;

periodically changing a phase difference between the first and second beams; and determining the positional deviation between the first and second objects on the basis of a phase difference between the first and second interference beams caused as a result of periodically changing the phase difference between the first and second beams in said changing step.

14. A method according to claim 13, wherein the first and second reflected beams are those beams of the first and second beams, respectively, which are regularly reflected by the first and second zones, respectively.

15. A semiconductor device manufacturing method for use with a reticle having a grating pattern and a wafer having a grating mark wherein positional deviation between the reticle and the wafer is detected and, after aligning the reticle and the wafer on the basis of the detection, an image of the reticle is projected through a projection lens system on the wafer by using an exposure beam having a first wavelength, the grating pattern of the reticle has spaced first and second zones that produce, when respectively illuminated with first and second beams, each having a second wavelength different from the first wavelength, first and second transmissively diffracted beams, respectively, which are projected through the projection lens system upon the grating mark of the wafer, said method comprising the steps of:

illuminating the first zone with the first beam to produce the first transmissively diffracted beam as well as a first reflected beam from the first zone;

illuminating the second zone with the second beam to produce the second transmissivley diffracted beam as well as a second reflected beam from the second zone;

diffracting the first and second transmissively diffracted beams again by the grating mark of the second object to produce twice-diffracted beams which are then caused to interfere with each other to produce a first interference beam and wherein the first and second reflected beams are caused to interfere with each other to produce a second interference beam;

periodically changing a phase difference between the first and second beams; and determining the positional deviation between the first and second objects on the basis of a phase difference between the first and second interference beams caused as a result of periodically changing the phase difference between the first and second beams in said changing step.

16. A method according to claim 15, wherein the second wavelength is longer than the first wavelength.

17. A method according to claim 16, wherein the first and second reflected beams are those beams of the first and second beams, respectively, which are regularly reflected by the first and second zones, respectively.

18. A projection exposure apparatus for projecting an image of a circuit pattern of a reticle upon a wafer by using a projection lens system and an exposure beam having a first wavelength, wherein the reticle has a grating pattern while the wafer has a grating mark, the grating pattern of the reticle having spaced first and second zones that produce, when respectively illuminated with first and second beams, each having a second wavelength different from the first wavelength, first and second transmissivley diffracted beams, respectively, which are projected through the projection lens system upon the grating mark of the wafer, said apparatus comprising:

illuminating means for illuminating the first zone with the first beam to produce the first transmissively diffracted beam as well as a first reflected beam from the first zone, and for illuminating the second zone with the second beam to produce the second transmissively diffracted beam as well as a second reflected beam from the second zone;

wherein the first and second transmissivley diffracted beams are diffracted again by the grating mark of the second object to produce first and second, twice-diffracted beams which are then caused to interfere with each other to produce a first interference beam and the first and second reflected beams are caused to interfere with each other to produce a second interference beam;

first converting means for receiving the first interference beam to produce a first signal;

second converting means for receiving the second interference beam to produce a second signal;

changing means for periodically changing a phase difference between the first and second beams; and means for determining the positional deviation between the first and second objects on the basis of a phase difference between the first and second interference beams caused as a result of the changing made by said changing means.

19. A projection exposure apparatus for projecting an image of a circuit pattern of a reticle upon a wafer by a projection lens system and an exposure beam having a first wavelength, wherein the reticle has a grating pattern while the wafer has a grating mark, the grating pattern of the reticle having spaced first and second zones each of produce, when illuminated with a radiation beam having a second wavelength different from the first wavelength, a transmissively diffracted beam that is projected through the projection lens system upon the grating mark of the wafer, said apparatus comprising:

a laser for producing the radiation beam;

a polarization beam splitter for dividing the radiation beam produced by said laser into first and second beams having orthogonal planes of polarization;

a modulator, disposed in a portion of a path of the radiation beam between said laser and said polarization beam splitter, for modulating the radiation beam to periodically change a phase difference between the first and second beams;

quarter waveplate means for receiving the first and second beams from said polarization beam splitter, wherein the received first beam is then substantially perpendicularly incident on the first zone of the grating pattern of the reticle, while the received second beam is then substantially perpendicularly incident on the second zone of the grating pattern of the reticle, such that (i) transmissively diffracted beams are produced form the first and second zones, respectively, and (ii) first and second regularly reflected beams are also produced from the first and second zones, respectively, and wherein the transmissively diffracted beams are then diffracted by the grating mark of the wafer to produce twice-diffracted beams;

first photoelectric converting means comprising a first analyzer, for receiving the twice-diffracted beams passed through said projection lens system and said quarter waveplate means, and for converting a first interference beam caused by interference of the twice-diffracted beams into a first signal;

second photoelectric converting means comprising a second analyzer, for receiving the regularly reflected beams passed through said quarter waveplate means and said polarization beam splitter, and for converting a second interference beam caused by interference of the regularly reflected beams into a second signal; and means for receiving the first and second signals and for determining the positional deviation between the reticle and the wafer on the basis of a phase difference between the first and second signals.

20. A projection exposure apparatus for projecting an image of a circuit pattern of a reticle upon a wafer by a projection lens system and an exposure beam having a first wavelength, wherein the reticle has a grating pattern while the wafer has a grating mark, the grating pattern of the reticle having space first and second zones each of produce, when illuminated with a radiation beam having a second wavelength different from the first wavelength, a transmissivley diffracted beam that is projected through the projection lens system upon the grating mark of the wafer, said apparatus comprising:

a laser for producing the radiation beam;

first quarter waveplate means for transforming the radiation beam produced by said laser into a circularly polarized radiation beam;

a polarization beam splitter for dividing the radiation beam from said first quarter waveplate means into first and second beams having orthogonal planes of polarization;

a modulator, disposed in a portion of a path of the radiation beam between said first quarter waveplate means and said polarization beam splitter, for modulating the radiation beam to periodically change a phase difference between the first and second beams;

second quarter waveplate means for receiving the first and second beams from said polarization beam splitter, wherein the received first beam is then substantially perpendicularly incident on the first zone of the grating pattern of the reticle, while the received second beam is then substantially perpendicularly incident on the second zone of the grating pattern of the reticle, such that (i) the transmissively diffracted beams are produced from the first and second zones, respectively, and (ii) the first and second regularly reflected beams are also produced from the first and second zones, respectively, wherein the transmissivley diffracted beams are then diffracted by the grating mark of the wafer to produce twice-diffracted beams;

first photoelectric converting means comprising a first analyzer, for receiving the twice-diffracted beams passed through said projection lens system and said second quarter waveplate means, and for converting a first interference beam caused by interference of the twice-diffracted beams into a first signal;

second photoelectric converting means comprising a second analyzer, for receiving the regularly reflected beams passed through said second quarter waveplate means and said polarization beam splitter, and for converting a second interference beam caused by interference of the regularly reflected beams into a second signal; and means for receiving the first and second signals and for determining the positional deviation between the reticle and the wafer on the basis of determining whether the first signal comprises a DC signal or an AC signal, when the second signal comprises a DC signal through modulation of the first and second beams by said modulator.

21. A method of detecting positional deviation between a first object having a grating pattern and a second object having a grating mark, wherein the first and second objects are placed at positions that are optically conjugate with each other with respect to a projection lens system and with reference to a first wavelength, the grating pattern of the first object has spaced first and second zones that produce, when respectively illuminated with first and second beams, each having a second wavelength different from the first wavelength, first and second transmissivley diffracted beams, respectively, which are projected through the projection lens system upon the grating mark of the second object, said method comprising the steps of:

illuminating the first zone with the first beam to produce the first transmissively diffracted beam as well as a first reflected beam from the first zone;

illuminating the second zone with the second beam to produce the second transmissivley diffracted beam as well as a second reflected beam from the second zone;

diffracting the first and second transmissively diffracted beams again by the grating mark of the second object to produce twice-diffracted beams which are then caused to interfere with each other to produce a first interference beam and wherein the first and second reflected beams are caused to interfere with each other to produce a second interference beam;

periodically changing a phase difference between the first and second beams; and determining the positional deviation between the first and second objects on the basis of a change in intensity of the first interference beam caused when the phase difference between the first and second beams is periodically changed, but while the intensity of the second interference light is maintained substantially unchanged, in said changing step.

22. A method according to claim 21, wherein the first and second reflected beams are those beams of the first and second beams, respectively, which are regularly reflected by the first and second zones, respectively.

23. A semiconductor device manufacturing method for use with a reticle having a grating pattern and a wafer having a grating mark, wherein positional deviation between the reticle and the wafer is detected and, after aligning the reticle and the wafer on the basis of the detection, an image of a circuit pattern of the reticle is projected on the wafer by a projection lens system and an exposure beam having a first wavelength, the grating pattern of the reticle having spaced first and second zones that produce, when respectively illuminated with first and second beams, each having a second wavelength different from the first wavelength, first and second transmissively diffracted beams, respectively, which are projected through the projection lens system upon the grating mark of the wafer, said method comprising the steps of:

illuminating the first zone with the first beam to produce the first transmissively diffracted beam as well as a first reflected beam from the first zone;

illuminating the second zone with the second beam to produce the second transmissivley diffracted beam as well as a second reflected beam from the second zone;

diffracting the first and second transmissively diffracted beams again by the grating mark of the second object to produce twice-diffracted beams which are then caused to interfere with each other to produce a first interference beam and wherein the first and second reflected beams are caused to interfere with each other to produce a second interference beam;

periodically changing a phase difference between the first and second beams; and determining the positional deviation between the reticle and the wafer on the basis of a change in intensity of the first interference beam caused when the phase difference between the first and second beams is periodically change, but while the intensity of the second interference light is maintained substantially unchanged, in said changing step.

24. A method according to claim 23, wherein the second wavelength is longer than the first wavelength.

25. A method according to claim 24, wherein the first and second reflected beams are those beams of the first and second beams, respectively, which are regularly reflected by the first and second zones, respectively.

26. A projection exposure apparatus for projecting an image of a circuit pattern of a reticle upon a wafer by a projection lens system and an exposure beam having a first wavelength, wherein the reticle has a grating pattern while the wafer has a grating mark, the grating pattern of the reticle having spaced first and second zones that produce, when respectively illuminated with first and second beams, each having a second wavelength different from the first wavelength, first and second transmissivley diffracted beams, respectively, which are projected through the projection lens system upon the grating mark of the wafer, said apparatus comprising:

illuminating means for illuminating the first zone with the first beam to produce the first transmissively diffracted beam as well as a first reflected beam from the first zone, and for illuminating the second zone with the second beam to produce the second transmissively diffracted beam as well as a second reflected beam from the second zone;

wherein the first and second transmissivley diffracted beams are diffracted again by the grating mark of the second object to produce first and second, twice-diffracted beams which are then caused to interfere with each other to produce a first interference beam and the first and second reflected beams are caused to interfere with each other to produce a second interference beam;

first converting means for receiving the first interference beam to produce a first signal;

second converting means for receiving the second interference beam to produce a second signa;;

changing means for periodically changing a phase difference between the first and second beams; and means for receiving the first and second signals and for determining the positional deviation between the reticle and the wafer on the basis of determining whether the first signal comprises a DC signal or an AC signal, when the second signal comprises a DC signal through periodically changing the phase difference between the first and second beams by said changing means.

27. A method of detecting positional deviation between a first object having a grating pattern and a second object having a grating mark, wherein the first and second objects are placed at positions that are optically conjugate with each other with respect to a projection lens system and with reference to a first wavelength, the grating pattern of the first object has spaced first and second zones that produce, when respectively illuminated with first and second beams, each having a second wavelength different from the first wavelength, first and second transmissively diffracted beams, respectively, which are projected through the projection lens system upon the grating mark of the second object, said method comprising the steps of:

illuminating the first zone with the first beam to produce the first transmissively diffracted beam as well as a first reflected beam from the first zone;

illuminating the second zone with the second beam to produce the second transmissivley diffracted beam as well as a second reflected beam from the second zone;

diffracting the first and second transmissively diffracted beams again by the grating mark of the second object to produce twice-diffracted beams which are then caused to interfere with each other to produce a first interference beam, and wherein the first and second reflected beams are caused to interfere with each other to produce a second interference beam; and determining the positional deviation between the first and second objects on the basis of the first and second interference beams.

* * * * *

UNITED STATES PATENT AND TRADEMARK OFFICE
CERTIFICATE OF CORRECTION

PATENT NO. : 5,182,455
DATED : January 26, 1993
INVENTOR(S) : Masato Muraki

It is certified that error appears in the above-identified patent and that said Letters Patent is hereby corrected as shown below:

COLUMN 2

Line 34, "when" should read --when a--; and
    Line 37, form" should read --from-- and "sued" should read --used--.

COLUMN 3

Line 17, "loner" should read --longer--; and
    Line 40, "bias" should read --basis--.

COLUMN 4

Line 45, "eh" should read --the--.

COLUMN 5

Line 52, "148.4 nm" should read --248.4 nm--.

COLUMN 6

Line 1, "form" should read --from--;
    Line 13, "a" should read --an--; and
    Line 35, "beam" should read --beams--.

COLUMN 7

Line 61, delete "de-"; and
    Line 62, delete "pending".

UNITED STATES PATENT AND TRADEMARK OFFICE
CERTIFICATE OF CORRECTION

PATENT NO. : 5,182,455

DATED : January 26, 1993

INVENTOR(S) : Masato Muraki

It is certified that error appears in the above-identified patent and that said Letters Patent is hereby corrected as shown below:

COLUMN 9

Line 21, "distance Ld" should read --distance LD--;
    Line 28, "ares" should read --areas--; and
    Line 59, "expresses" should read --expressed--.

COLUMN 10

Line 6, "$A_y=A_0 exp"i(kt-\Delta E)]$" should read --$A_Y=A_0 exp[i(kt-\Delta E)]$--;
    Line 34, "conincident" should read --coincident--;
    Line 62, "if" should read --and if--;
    Line 65, "$A_y=\epsilon A_0 exp[(-i(kt-n\delta)]$" should read --$A_Y=\epsilon A_0 exp[-i(kt-n\delta)]$--; and
    Line 67, "hologram $G_2$" should read --hologram $G_{R2}$--.

COLUMN 11

Line 4, "$A_x=\epsilon A_0 exp[(-1(kt+n\delta-\Delta E)]$" should read --$A_X=\epsilon A_0 exp[-1(kt+n\delta-\Delta E)]$--;
    Line 18, "such" should read --such a--; and
    Line 58, "of" should read --or--.

COLUMN 12

Line 9, "FIG. 1" should read --the FIG. 1--.

UNITED STATES PATENT AND TRADEMARK OFFICE
CERTIFICATE OF CORRECTION

PATENT NO. : 5,182,455
DATED : January 26, 1993
INVENTOR(S) : Masato Muraki

It is certified that error appears in the above-identified patent and that said Letters Patent is hereby corrected as shown below:

COLUMN 14

Line 42, "in" should read --in said--.

COLUMN 15

Line 44, "of" should read --on--; and
    Line 66, "on" should read --one--.

COLUMN 16

Line 66, "respectivley" should read --respectively--.

COLUMN 17

Line 5, "transmissivley" should read --transmissively--;
    Line 30, "mark" should read --mark,--; and
    Line 48, "transmissivley" should read --transmissively--.

COLUMN 18

Line 14, "transmissivley" should read --transmissively--;
    Line 25, "transmissivley" should read --transmissively--;
    Line 27, "second," should read --second--; and
    Line 50, "of produce," should read --of which produce,--.

UNITED STATES PATENT AND TRADEMARK OFFICE
CERTIFICATE OF CORRECTION

PATENT NO. : 5,182,455

DATED : January 26, 1993

INVENTOR(S) : Masato Muraki

It is certified that error appears in the above-identified patent and that said Letters Patent is hereby corrected as shown below:

COLUMN 19

Line 5, "form" should read --from--;
    Line 34, "space" should read --spaced--;
    Line 35, "of produce," should read --of which produce,--;
    Line 37, "transmissivley" should read --transmissively--; and
    Line 68, "transmissivley" should read --transmissively--.

COLUMN 20

Line 30, "has" should read --having--;
    Line 34, "transmissivley" should read --transmissively; and
    Line 42, "transmissivley" should read --transmissively--.

COLUMN 21

Line 18, "transmissivley" should read --transmissively--;
    Line 35, "change," should read --changed,--; and
    Line 53, "transmissivley" should read --transmissively--.

UNITED STATES PATENT AND TRADEMARK OFFICE
CERTIFICATE OF CORRECTION

PATENT NO. : 5,182,455
DATED : January 26, 1993
INVENTOR(S) : Masato Muraki

It is certified that error appears in the above-identified patent and that said Letters Patent is hereby corrected as shown below:

COLUMN 22

Line 5, "transmissivley" should read --transmissively--;
Line 7, "second," should read --second--;
Line 16, "signa;;" should read --signal;--; and
Line 45, "transmissivley" should read --transmissively--.

Signed and Sealed this

First Day of February, 1994

Attest:

BRUCE LEHMAN

Attesting Officer

Commissioner of Patents and Trademarks